United States Patent [19]

Nakamura et al.

[11] Patent Number: 5,384,466
[45] Date of Patent: Jan. 24, 1995

[54] ELECTRON BEAM LITHOGRAPHY APPARATUS AND A METHOD THEREOF

[75] Inventors: Kazumitsu Nakamura, Hsinchu, Taiwan, Prov. of China; Rikio Tomiyoshi, Mito, Japan

[73] Assignees: Hitachi, Ltd., Tokyo; Hitachi Instruments Engineering Co., Ltd., Katasuta, both of Japan

[21] Appl. No.: 64,685

[22] Filed: May 20, 1993

[30] Foreign Application Priority Data

Jun. 1, 1992 [JP] Japan .................. 4-140274

[51] Int. Cl.[6] ............................................. H01J 37/302
[52] U.S. Cl. ................................ 250/492.22; 250/398
[58] Field of Search ............... 250/492.22, 492.2, 398

[56] References Cited

U.S. PATENT DOCUMENTS 4,625,121 11/1986 Hamaguchi ................ 250/492.22
4,943,729 7/1990 Ando et al. ................... 250/492.2

FOREIGN PATENT DOCUMENTS

53-118980 10/1978 Japan ........................... 250/492.2
2-138723 5/1990 Japan.

Primary Examiner—Jack I. Berman
Attorney, Agent, or Firm—Kenyon & Kenyon

[57] ABSTRACT

The object of the invention is to provide an electron beam lithography apparatus and a method thereof which, while maintaining a predetermined pattern drawing accuracy, enables the pattern drawing speed to be improved still further. An electron beam lithography apparatus comprising exposing an electron beam 2 from an electron gun 1, interrupting the electron beam 2 by means of a blanker 6, further deflecting the electron beam 2 by applying a voltage to a deflector 7, wherein the electron beam lithography apparatus is characterized by selecting one of a first predetermined period of time required for the voltage of the deflector 7 to be stabilized and a second period of time which is shorter than the foregoing first period of time, and wherein the blanker 6 is operated according to the result of the foregoing selection.

15 Claims, 10 Drawing Sheets

VOLTAGES AT MINIMUM CHANGE (ILSB)

FIG. 7(b)

VOLTAGES AT MAXIMUM CHANGE (FULL)

ELECTRON BEAM LITHOGRAPHY APPARATUS AND A METHOD THEREOF

BACKGROUND OF THE INVENTION

The present invention relates to an electron beam lithography apparatus and a method thereof, and more particularly to an electron beam lithography apparatus for drawing a desired pattern on a specimen by irradiating the electron beam thereon and a method thereof.

A fine processing technique in which an electron gun generates electron beams to irradiate a specimen, thereby conducting a fine processing so as to draw a desired pattern thereon, is widely practiced. In particular, such a fine processing technique is extensively utilized in manufacture of master pattern drawings of semiconductor designs. In order to draw a desired pattern, it is necessary to be able to direct an electron beam to an arbitrary position on a specimen for exposure thereof. A deflector serves this purpose and deflects the electron beam. The deflector is formed, for example, by a coil or the like, and generates a magnetic field. In accordance with changes in a voltage applied to the deflector, the electron beam is deflected so as to draw a desired pattern. When the pattern to be drawn exceeds the range of allowable deflection, the specimen itself is moved by transferring a specimen stage carrying the specimen. These related prior arts are disclosed in the Japanese Patent Application Laid-Open No.2-138723(1990) and so on.

However, even when a voltage for controlling the deflector is changed to change the deflection of the electron beam, the deflector is not changed, instantly. Namely, the voltage increases along a predetermined Gradient, and further undergoes a hunting phenomenon until the voltage is stabilized. If the voltage in the deflector is not stabilized, a deflection quantity of the electron bean cannot be determined, thereby causing the position of the electron beam to drift. According to the prior art, to solve this problem an exposure of an electron beam on the specimen is blocked by a beam blanker until the voltage in the deflector is sufficiently stabilized.

Further, once the specimen stage is moved, the stage undergoes an oscillation, taking some time until it stabilizes. If the stage does not stabilize, the electron beam cannot pinpoint an accurate position relative to the specimen. Thereby, according to the prior art, the electron beam was blocked from reaching the specimen until the stage had been stabilized.

Lately, very complicated drawing patterns are required, and such demand is increasing, in particular, in the fields of large scale integrated circuits (LSIs) and so on. For example, in manufacture of 64M RAMs, it is necessary to repeat an electron beam exposure as many as something on the order of $10^{10}$ times. Thereby, a high speed pattern drawing is desired to be implemented. The time required for drawing a pattern depends mainly on the exposure time of the electron beam and also on the time during which the electron beam is interrupted. According to the prior art, although the electron beam was blocked by the blanker until the voltage in the deflector had stabilized, if this interruption time can be reduced, a high speed pattern drawing can be attained. However, when the time for interruption of the electron beam is too short, the electron beam drifts, thereby making it difficult to execute a precise pattern drawing.

Further, the time elapsed until the completion of pattern drawing depends also on an electron beam interruption time required for moving the specimen stage. Although the electron beam was blocked until the stage had stabilized completely according to the prior art, if this blocking time is reduced, a high speed drawing can be attained. However, when the electron beam interruption time is shortened, the electron beam is allowed to be irradiated while the stage is still in drift, thereby making it difficult to perform a precise drawing.

SUMMARY OF THE INVENTION

The main object of the invention is to provide an electron beam lithography apparatus and a method thereof which is capable of, while maintaining a desired pattern drawing accuracy, improving a pattern drawing speed thereof.

In order to accomplish the foregoing object and other objects, an arrangement according to the invention comprises means for selecting between a first period of time required for the voltage in the deflector to substantially stabilize from the transient state of the voltage applied to the deflector in accordance with an object to be exposed to the electron beam and a second period of time defined within the first period of time which is shorter than the first period of time, means for blocking the electron beam during either one of the above periods of time selected, and means for exposing the specimen to the electron beam after the elapse of the above selected time.

Further, in order to accomplish the foregoing object, in an arrangement of the invention, a drawing sequence in drawing a master pattern drawing is changed depending on whether there is a need to move the specimen or not.

By means of the foregoing arrangement of the invention, a proper time for blocking the electron beam is selected appropriately, and in the case of an object to be exposed which requires a positional accuracy in the electron beam exposure, the electron beam is irradiated onto the specimen only after the voltage in the deflector is substantially stabilized. In contrast, in the case of an object to be exposed which requires not so great a positional accuracy, the electron beam is irradiated onto the specimen immediately before the voltage in the deflector is stabilized, thereby shortening the electron beam blocking time accordingly. Thereby, it becomes possible to improve the pattern drawing speed substantially while maintaining a desired drawing precision.

Further, while a desired sequence of pattern drawing is selected but the stage is not stabilized yet, the electron beam is directed to an object to be exposed which does not require so great a positional accuracy. Then, after the stage is stabilized, the electron beam is irradiated onto an object to be exposed which requires a positional precision. As described hereinabove, the electron beam is irradiated even at the time when the stage is not completely stabilized yet, thereby the pattern drawing speed can be improved substantially while maintaining the desired drawing precision.

DESCRIPTION OF THE PREFERRED EMBODIMENTS

Figure 2:
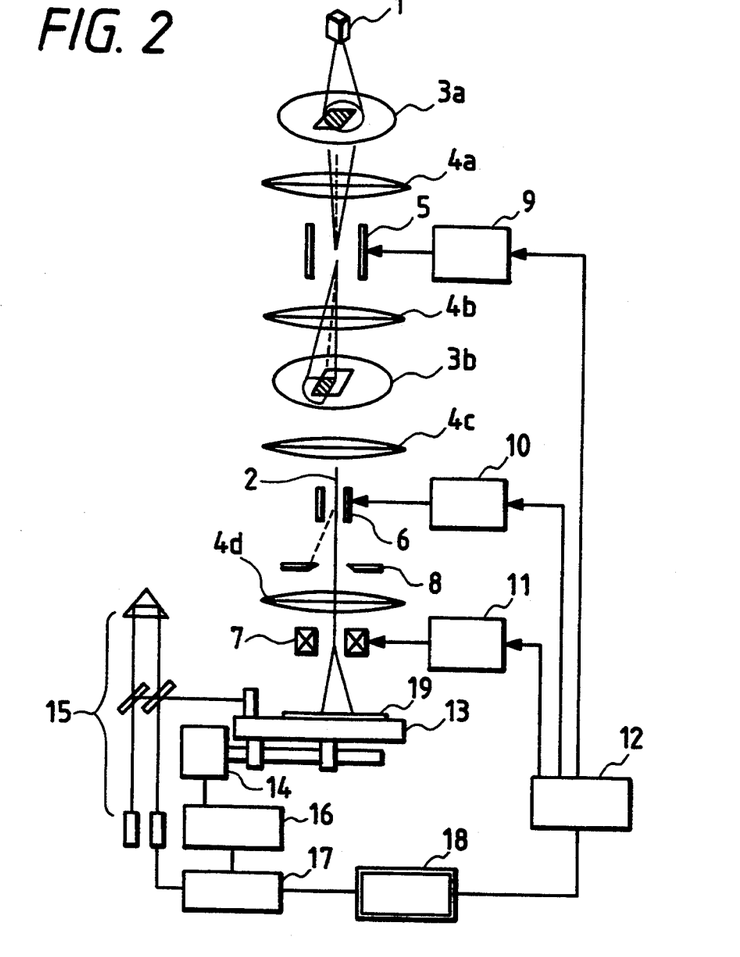
FIG. 2 is a schematic diagram illustrative of an arrangement of an electron beam lithography apparatus of the invention.

The present invention will now be described by way of preferred embodiments as applied to an electron beam lithography apparatus, and with reference to the accompanying drawings. First, an entire schematic arrangement and structure of an electron beam lithography apparatus is shown in FIG. 2. An electron beam 2 generated and emitted from an electron gun 1 is narrowed while passing through an aperture 3a and converges by means of a lens 4a into a shaping deflector 5. Further, the electron beam 2 passes through a lens 4b to be narrowed by means of an aperture 3b. Herein, the electron beam 2 is shaped into a desired shape pattern (a rectangle of 0.1 μm to 2 μm) in accordance with an appropriate voltage applied to the shaping deflector 5. The electron beam 2 from the aperture 3b passes through a lens 4c to converge in a blanker 6, then is narrowed by means of an aperture 8. Here, if the blanker 6 is ON-state, the electron beam is prevented from passing through the aperture 8, and in contrast if the blanker 6 is OFF-state, the electron beam 2 is permitted to pass through the aperture 8. The electron beam 2 from the blanker 6 passes through a lens 4d to converge in a deflector 7. Herein, the electron beam 2 is caused to deflect a predetermined quantity corresponding to a voltage applied to the deflector 7 so as to spot on a desired position on a specimen 19. The specimen 19 is mounted on an x-y stage 13 to be transferred as desired.

A computer 18 executes arithmetic operation as programmed, and outputs the results of arithmetic operation to a stage controller 17. The stage controller 17 in response to this signal received puts out a signal to a motor controller 16 to drive a motor 14 so as to move the x-y stage 13 as desired. Through such operations as above, the computer 18 permits the x-y stage 13 to be transferred so as to adjust the specimen to be positioned at a desired position at a high precision of ±1 μm or less. Further, a quantity of movement of the x-y stage 13 is detected by a laser interferometer 15, and a detected value is input into the stage controller 17. The computer 18 outputs signals through a data controller 12 to the shaping controller 9, the blanker controller 10 and the deflection controller 11, thereby controlling the shaping deflector 5, the blanker 6 and the deflector 7.

Figure 3:
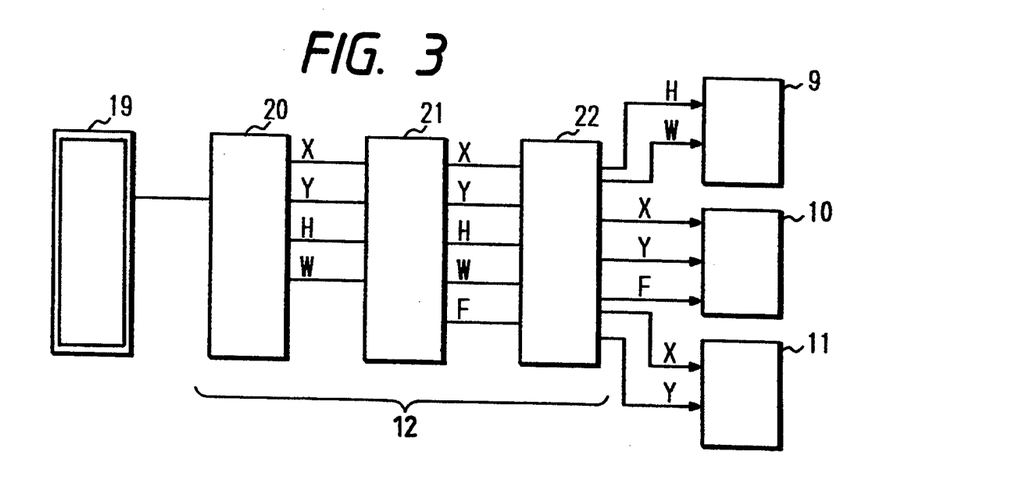
FIG. 3 is a schematic block diagram illustrative of controlling of an electron beam in detail.
Figure 4A:
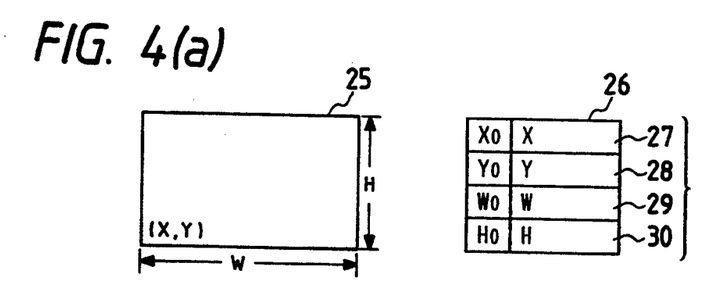
FIGS. 4(a)-(c) illustrate a series of drawing patterns for drawing an original master pattern drawing.

Next, control of the electron beam 2 will be set forth in detail with reference to a block diagram shown in FIG. 3. A master pattern to be drawn, for example, an LSI pattern is read out from an external memory such as a disk or the like to be stored in a buffer memory 20 as pattern data in sequence. FIG. 4(a) indicates a master pattern 25 and a master pattern data 26. The master pattern data 25 are comprised of data codes representative of respective reference positions of the master pattern 25 (reference positions X27 in the horizontal direction, and Y28 in the vertical direction), a width W29 of the master pattern and a height H30 thereof, respectively.

Figures 4B, 4C:
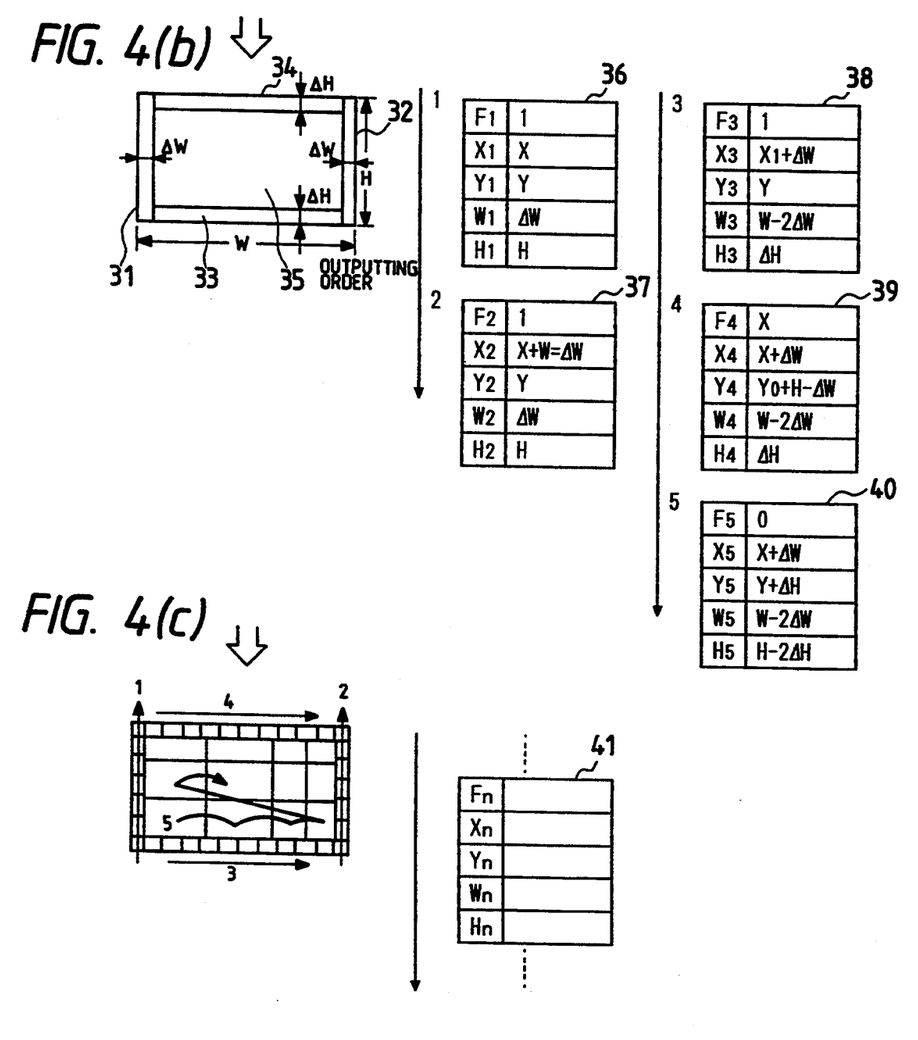

A contour dividing circuit 21 reads out a pattern data 26 representative of such master pattern 25 as above from the buffer memory 20, divides the master pattern 25 into contour portions (31 through 34) and an interior portion 35 (width: W−2ΔW, height: H−2ΔH), and outputs the same as pattern data. This process is shown in FIG. 4(b). Although further detailed explanations are omitted, this process is done in order to improve dimensional accuracies of a drawing pattern.

The contour portions are composed of a right side portion 31 (having a width ΔW), a left side portion 32 (having a width ΔW), a bottom side portion (having a width ΔH), and an upper side portion (having a width ΔH). The contour dividing circuit 21 outputs pattern data divided as above as sets of pattern data 36 through 40 in the order from the pattern data 36 to 40. At this time the contour dividing circuit 21 attaches a flag indicative of whether it is a contour portion or the interior portion to each data set to be output (F1 through F5 relative to pattern data 36 through 40). Namely, pattern data for a contour portion is attached with flag 1, and that for the interior portion is attached with flag 0.

A pattern dividing circuit 22, in response to pattern data 36 through 40 output from the contour dividing circuit 21, further divides these data such that each division has an area less than the maximum exposable area to be covered by one shot (maximum projection spot size) by the electron gun 1, and outputs such divided data as a unit pattern data 41. The unit pattern data set 41, as shown in FIG. 4(c), is comprised of data codes representing reference positions of the pattern (horizontal reference position Xn, vertical reference position Yn), a pattern width Wn, a pattern height Hn and a flag Fn indicative of a contour portion.

The shaping controller 9 receives data indicative of a pattern size (pattern width Wn, pattern height Hn) from the pattern dividing circuit 22, and applies a voltage in accordance with this data to the shaping deflector 5 so as to shape the electron beam 2 into a desired shape.

Figure 7A:
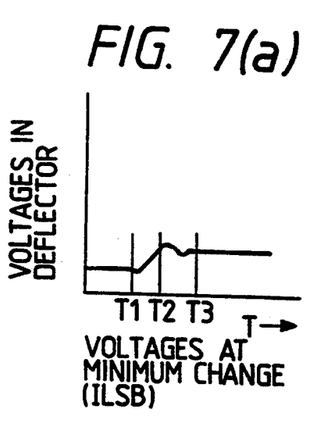
FIGS. 7(a) and (b) illustrate the blanker off-time more in detail.
Figure 7B:
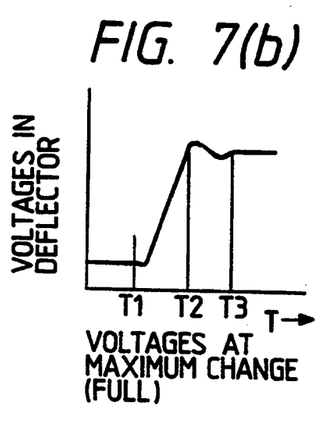

The deflector controller 10 receives pattern position data (horizontal reference position Xn, vertical reference position Yn) from the pattern dividing circuit 22, and changes the voltage to be applied to the deflector 7 in accordance with this data thereby causing the electron beam 2 to move to a predetermined position. Even though the voltage to be applied to the deflector 7 is changed, the voltage in the deflector 7 cannot be stabilized abruptly but takes some time to settle as shown in FIG. 7(a) and (b).

Figure 5A:
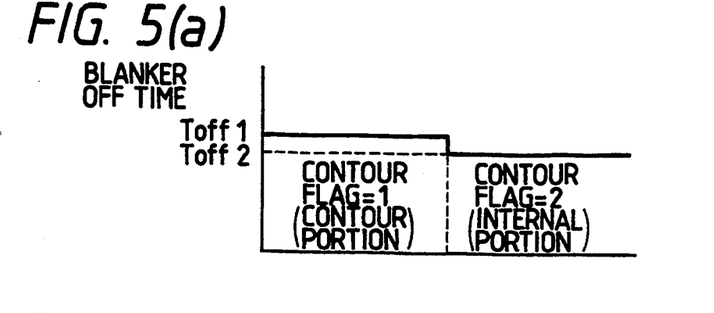
FIGS. 5(a)-(c) are a diagrammatical drawing illustrative of a blanker off-time.
Figure 5B:
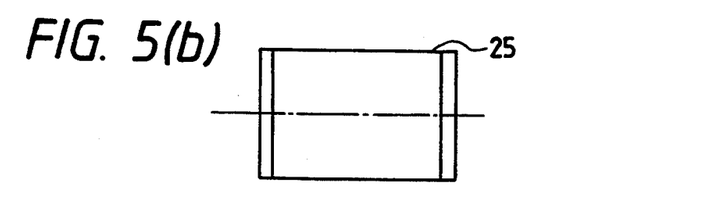
Figure 5C:
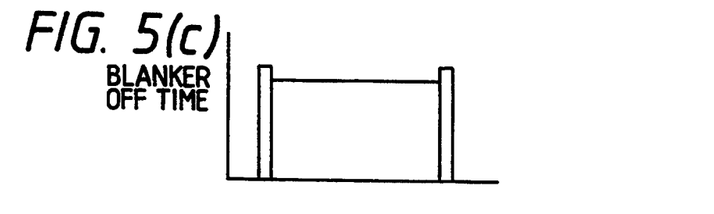

The blanker controller 10, in response to a flag Fn indicative of the contour portion (hereafter referred to as the contour flag) from the pattern dividing circuit 22, obtains an appropriate exposure time for the electron beam 2 (blanker off time Toff) on the basis of a relationship as shown in FIG. 5(a), and prevents a voltage to be applied to the blanker 6 for a predetermined period of time. Namely, the exposure time of the electron beam 2 is set at a greater value in the contour portions, in contrast it is set at a smaller value in the interior portion. Exposure time Toff (blanker off time) of the electron beam 2 along dashed lines in FIG. 5(b) in a portion cut out from the interior portion of the master pattern 25 is shown in FIG. 5(c).

Figure 6:
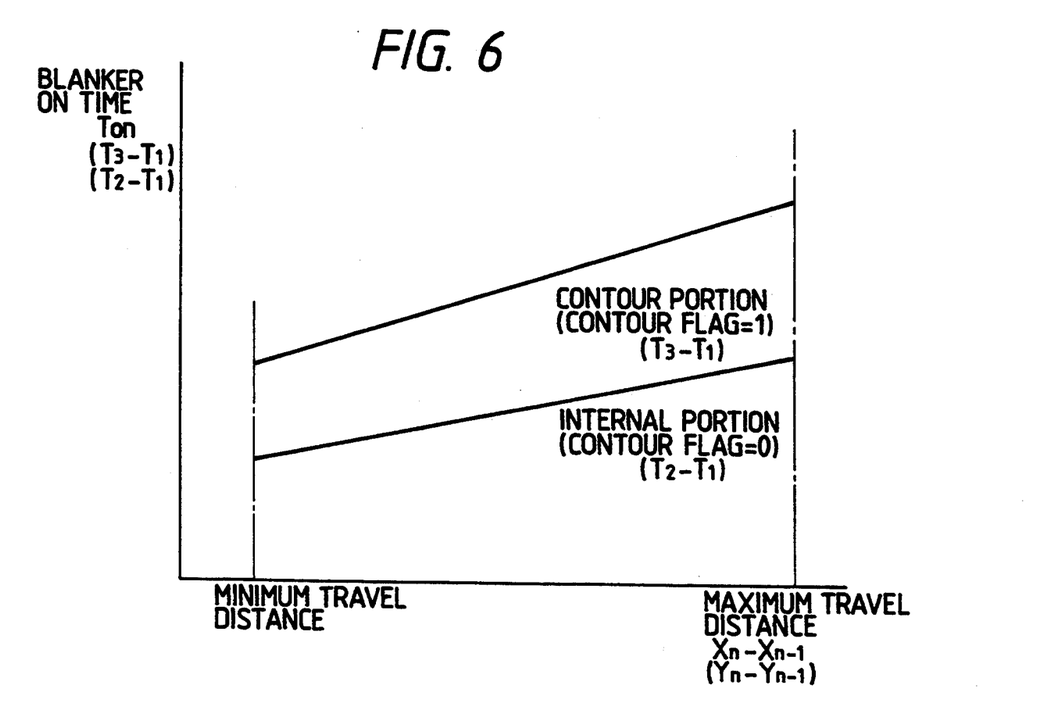
FIG. 6 illustrates a relationship between the drawing patterns and the blanker off-time.

In accordance with the state of a contour flag Fn from the pattern dividing circuit 22, the blanker controller 10 determines an interruption time Ton (blanker on time) for the electron beam 2 based on the relationship of FIG. 6, and applies a voltage to the blanker 6 for a predetermined period of time (a time until the voltage of the deflector 7 stabilizes or slightly shorter than that). Namely, the interrupting time for the electron beam 2 is prolonged in the contour portion, and in contrast it is shortened in the interior portion. Typically, device arrangements and structures are becoming increasingly complex in the most advanced semiconductor designs, and the number of exposures to electron beams required for pattern drawing of one layer, for example, of a 64 MDRAM becomes as many as the tenth power of $10^{10}$. A drawing time required for drawing one layer thereof is determined mainly by an exposure time per shot of the electron beam 2 and an interruption time of the electron beam 2, thereby it becomes necessary for the interruption time of the electron beam to be minimized. The interruption time of the electron beam 2 is determined, in principle, by a response time of the deflector 7. If the exposure of the electron beam 2 is allowed before the voltage applied to the deflector 7 stabilizes as shown in FIGS. 7(a) and (b), positional accuracies of a pattern drawing on the specimen 19 will deteriorate. Thereby, a pattern to be drawn is divided into contour portions (by framing), then in the case of pattern drawing of the contour regions where a high accuracy is required, the electron beam 2 is interrupted for a sufficient time enough for the deflector 7 to be able to respond and stabilize, and in the case of the interior portion where the positional accuracy required is relatively lower, the interruption time can be shortened. It can be compared, by way of example, to painting where in any peripheral portion, paints must be brushed with care lest they should run off the frame, but in the interior portion substantially identical finishing effects will be obtained even with rough brushing.

Generally, a sufficient time necessary for the deflector 7 to fully respond to a signal depends on a travel length of the electron beam 2. The blanker controller 10 obtains respective travel lengths in the horizontal and vertical directions on the basis of the preceding reference positions (horizontal reference position Xn−1, vertical reference position Yn−1) and the current reference positions (horizontal reference position Xn, vertical reference position Yn), then selects either one of a horizontal travel length and a vertical travel length that is larger, then on the basis of thus selected length and the relationship as shown in FIG. 6 an interruption time Ton is obtained for the electron beam 2 (blanker off-time), and in accordance therewith the electron beam 2 is interrupted.

Figure 8:
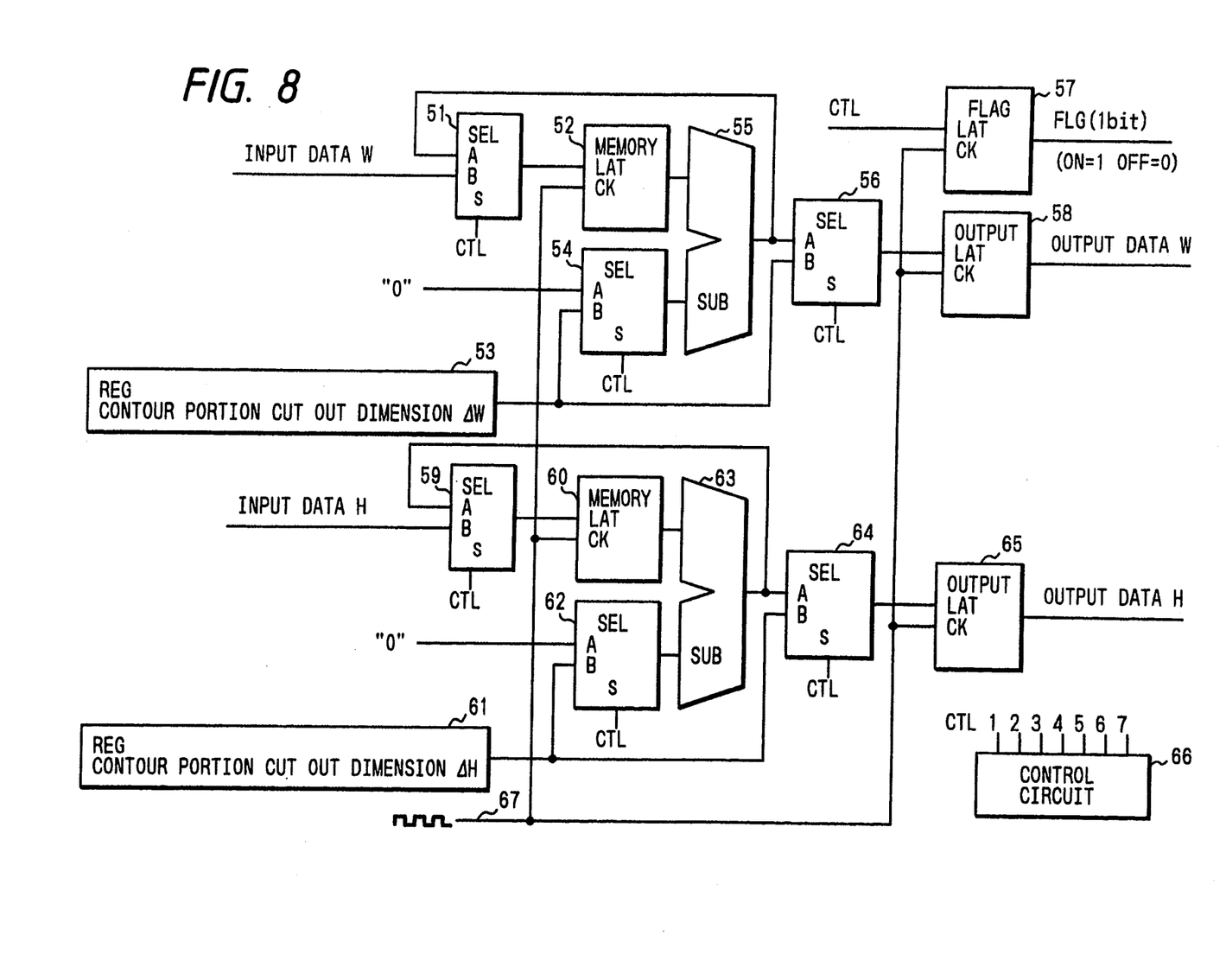
FIG. 8 is a detailed block diagram of a contour division circuit of the invention.

The contour dividing circuit 21 will be set forth in detail with reference to FIGS. 8 through 11. In FIG. 8, to one terminal of a selector 51 is input a master pattern width data W from a buffer memory 20, while to other terminal of the selector 51 is input an output from a subtracter 55 which will be described later. The selector 51 receives at its terminal S an output from a control circuit 66, whereby one of the input terminals A and B is selected for outputting. The output from the selector 51 is input into a latch 52. The latch 52 stores input information when a clock 67 is changed. Numeral "0" is input to one terminal of a selector 54 and a contour cut out dimension ΔW which has been stored in a register 53 is input to other terminal of the selector 51. The selector 54 receives, likewise the selector 51, through its terminal S, an output from the control circuit 66, whereby one of the input terminals A and B is selected for outputting thereof. An output of the latch 52 and an output of the selector 54 are both input into the subtracter 55. An output from the subtracter 55 is input to the selector 51 as described above. The output from the subtracter 55 is input to one terminal of the selector 56, and further to other input terminal of the selector 56 is input a contour portion cutout dimension ΔW. The function of the selector 56 is the same as the function of other selectors (selectors 59, 62 and 64 to be described later have the same function, thereby explanation of which will be omitted). An output from the selector 56 as an output data synchronized with a clock 67 by means of a latch 58, is input to the pattern dividing circuit 22.

Through one input terminal of a selector 59 is input a master pattern height data H from the buffer memory 20, and through the other input terminal of the selector 59 is input an output from a subtracter 63 to be described later. An output from the selector 59 is input into a latch 60. A selector 62 is input with numeral "0" at one input terminal thereof, and with a contour portion cutout dimension ΔH which has been stored in a register 61 at other input terminal thereof. An output from the latch 20 and an output from the selector 62 are both input into the subtracter 63. An output from the subtracter 63 is input into the selector 59 as has been described in the above. An output of the subtracter 63 is input to one input terminal of a selector 64, and further to another input terminal of the selector 64 is input a contour portion cutout dimension ΔH. An output from the selector 64 as an output data synchronized with a clock 67 by means of a latch 65, is input into the pattern dividing circuit 22.

A flag latch 57 is input through its input terminal with an output from the control circuit 66. This output from the control circuit 66 is synchronized with a clock signal therein, and is input to the pattern dividing circuit 22 as a contour flag F.

Figure 9A:
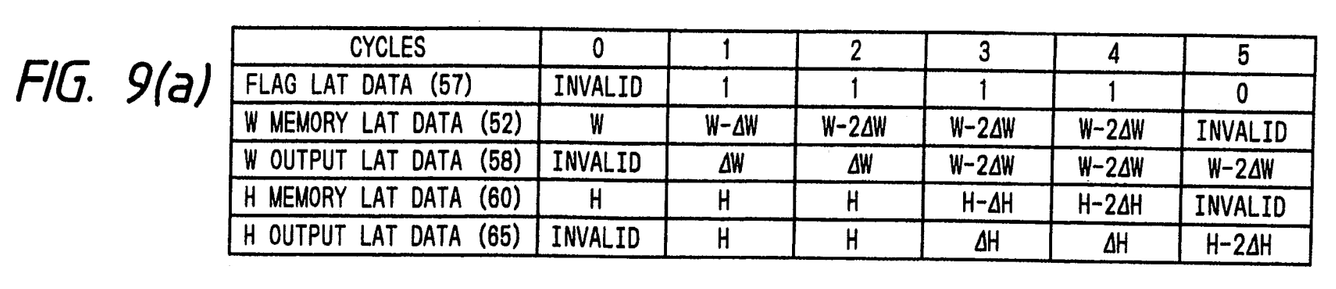
FIGS. 9(a)-(c) explain operations of the contour division circuit of the invention.
Figure 9B:
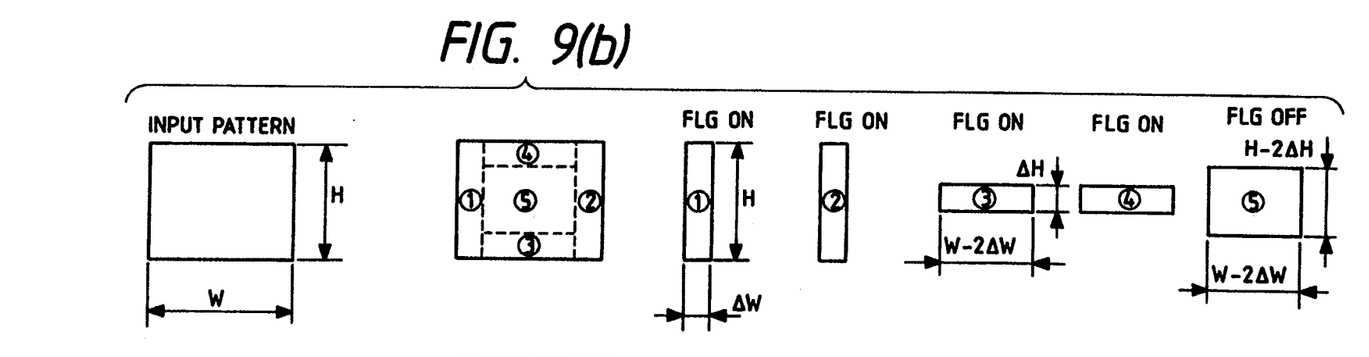
Figure 9C:
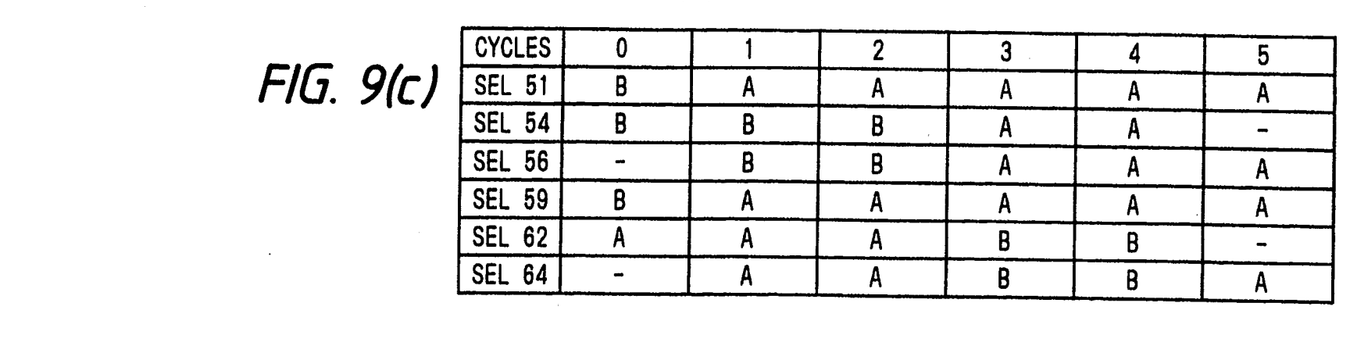

Next, the process of operation of this circuit will be described in detail with reference to FIG. 9. First of all, prior to a first clock signal being output, a provisional step is taken for ensuring the first clock to be started (setting up a 0-th clock). The control circuit 66 outputs control signals CTLs to terminals S of the selectors 51, 54, 56, 59, 62 and 64. Thereby, the selector 51 is caused to select an input B, and the selector 54 is caused to select an input B so as to output the same, respectively. Thereby, the selector 51 selects input data W, and the selector 54 selects ΔW. These values are output to the subtracter 55, then the subtracter 55 outputs W−ΔW. Further, the selector 59 is caused to select input B, and the selector 62 is caused to select input A. Thereby, the selector 59 selects input data H, and the selector 62 selects numeral "0" then to output each selected value, respectively. The subtracter 63 into which the foregoing outputs are entered outputs H. Thereby, the provisional steps associated with the first clock issuance have been completed. When the first clock is output, the output from the selector 51 and the output from the selector 59 are stored in the latch 52 and the latch 60 respectively.

When the first clock is output, the control circuit 66 outputs control signals CTLs 1 through 6 (control signal CTL 7 is output to the flag latch 57) to the selectors 51, 54, 56, 59, 62 and 64 through each terminal S thereof so as to cause each selector to select each relevant input. Thereby, the selector 51 selects input A to output. The selector 54 selects input B to output. The selector 56 selects input B to output. Likewise, the selector 59 selects input A, and the selector 62 selects input A. Further, the selector 64 selects input A.

In the operations of individual selectors as above, the selector 54 selects a contour portion cutout dimension $\Delta W$ to output the same. The selector 51 selects an output $(W-\Delta W)$ from the subtracter 52 on the 0-th clock, and stores the same in the latch 52. The subtracter 55 executes subtraction between the latch content at the 0-th clock which is stored in the latch 52 and the output of the selector 54, thus outputting $W-\Delta W$. The selector 56 selects $\Delta W$ so as to output the same. On the other hand, the selector 62 selects numeral "0" to output the same therethrough. The selector 59 selects an output value H from the subtracter 63 obtained at the 0-th clock, to store the same in the latch 60. The subtracter 63 executes subtraction between the latch content at the 0-th clock stored in the latch 60 and the output of the selector 62, thus outputting H. Then, the selector 64 selects H to output the same therethrough.

When the second clock signal is output, the control circuit 66 controls such that the selector 51 selects input A, the selector 54 selects input B, the selector 56 selects input B, the selector 59 selects input A, the selector 62 selects input A and the selector 64 selects input A.

In the operations of individual selectors as above, the selector 54 selects a contour portion cutout dimension $\Delta W$ to output the same therethrough. The selector 51 selects an output $(W-\Delta W)$ from the subtracter 55 obtained at the first clock signal, to store the same in the latch 52. The subtracter 55 executes subtraction between the stored content of the latch 52 obtained at the first clock signal and the output of the selector 54, thus outputting $W-2\Delta W$. The selector 56 selects $\Delta W$ to output the same therethrough. On the other hand, the selector 62 selects numeral "0" to output the same therethrough. The selector 59 selects an output value H from the subtracter 63 obtained at the first clock signal, and stores the same in the latch 60. The selector 62 selects numeral "0" and outputs the same therefrom. The subtracter 63 subtracts the output of the selector 62 from the stored content stored in the latch 60 obtained at the first clock signal, then outputs H. The selector 64 selects H to output the same.

When the third clock signal is output, the control circuit 66 controls such that the selector 51 selects input A, the selector 54 selects input A, the selector 56 selects input A, the selector 59 selects input A, the selector 62 selects input B, and the selector 64 selects input B.

In the foregoing operations of individual selectors, the selector 54 selects numeral "0" to output the same, the selector 51 selects the output $(W-2\Delta W)$ of the subtracter 55 obtained on the second clock signal to store the same in the latch 52, the subtracter 55 subtracts the output of the selector 54 from the stored content stored in the latch 52 obtained on the second clock signal thus outputting $W-2\Delta W$, the selector 56 selects $W-2\Delta W$ to output the same. On the other hand, the selector 62 selects $\Delta H$ to output the same, the selector 59 selects an output value H of the subtracter 63 obtained on the second clock signal then to store the same in the latch 60, the subtracter 63 subtracts an output of the selector 62 from the stored content stored in the latch 60 obtained on the second clock signal then outputs $H-\Delta H$, and the selector 64 selects $\Delta H$ to output the same.

When the fourth clock signal is output, the control circuit 66 controls such that the selector 51 selects input A, the selector 54 selects input A, the selector 56 selects input A, the selector 59 selects input A, the selector 62 selects input B, and the selector 64 selects input B. Thereby, the latch 52 stores $W-2\Delta W$, then the selector 56 selects $W-2\Delta W$ to be output. The latch 60 stores $H-2\Delta H$, then the selector 64 selects $\Delta H$ to be output.

When the fifth clock signal is output, the control circuit 66 controls such that the selector 54 selects input A, the selector 56 selects input A, the selector 62 selects input A, and the selector 64 selects input A. When this clock is output, one cycle of operations is completed. Then, when the next 0-th clock is output whereby the provisional stage being effected, the selector 51 and the selector 59 are not utilized. When the fifth clock is output, the selector 56 selects $W-2\Delta W$, and the selector 64 selects $H-2\Delta H$. One cycle of frequency terminates on outputting of this clock signal, then the next 0-th clock signal is output to repeat the similar operations.

Figure 10:
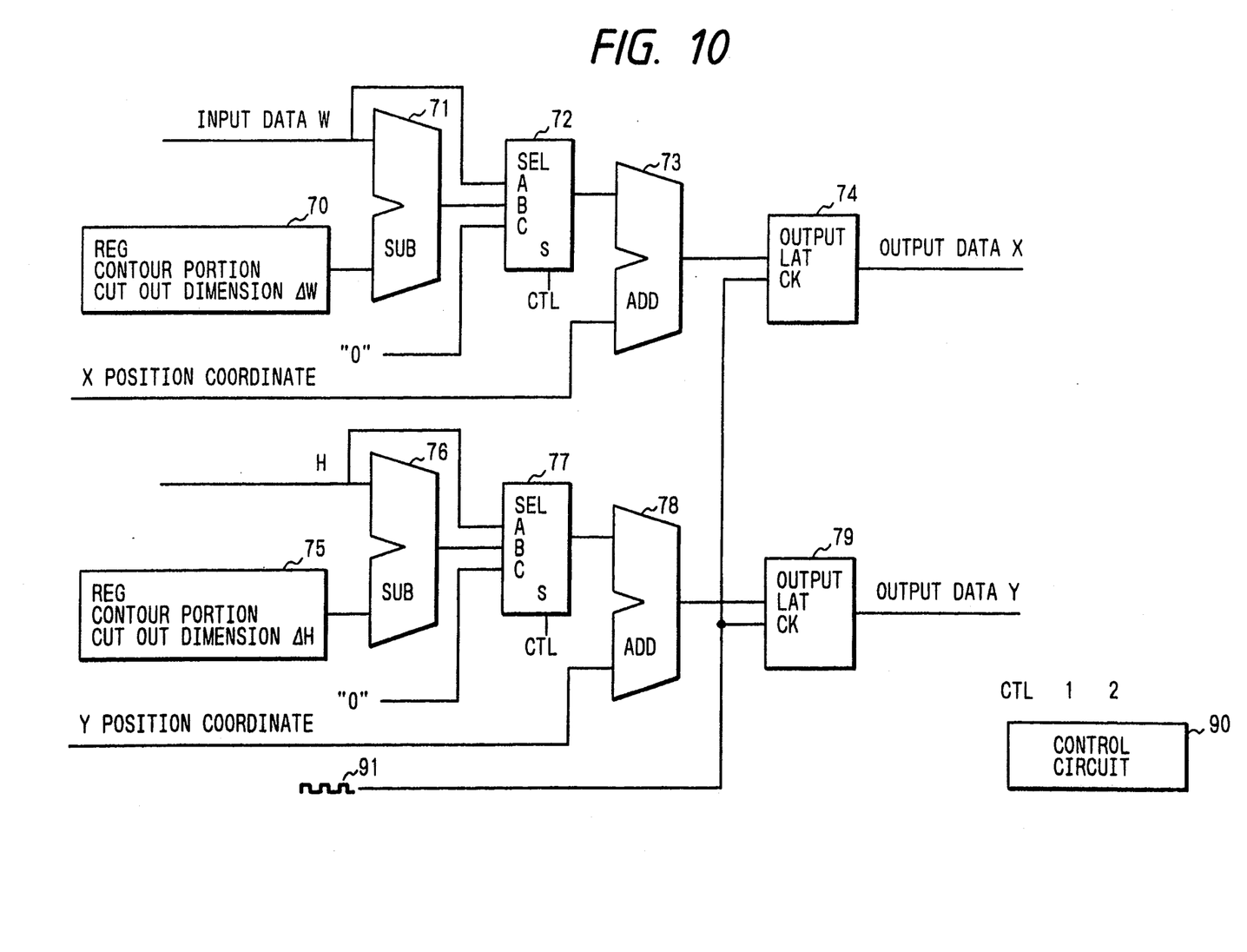
FIG. 10 is a detailed block diagram of another contour division circuit of the invention.

Further, the contour dividing circuit 21 will be described in detail in the following. With reference to FIG. 10, through one input terminal of a subtracter 71 is input a width data W of the master pattern from the buffer memory 20, and through the other input terminal of the subtracter 71 is input a contour portion cutout dimension $\Delta W$ which has been stored in a register 70. A selector 72 is provided with three input terminals through which a width data W of the master pattern, an output from the subtracter 71 and numeral "0" are entered, respectively. The selector 72 receives a control signal CTL1 from a control circuit 90, and selects one of these three inputs to be output in response to the control signal. An output from the selector 72 is input into an adder 73, and a horizontal direction reference position X is entered therein from the buffer memory 20 through the other input terminal of the adder 73. Further, an output from the adder 73 is output in synchronization with a clock 91 by means of a latch 74 so as to be input into the pattern dividing circuit 22.

Through one of the input terminals of a subtracter 76 is input a height data H of the master pattern from the buffer memory 20, and through the other input terminal of the subtracter 76 is input a contour portion cutout dimension $\Delta H$ which has been stored in a register 75. A selector 77 is provided with three input terminals through which a width data H of the master pattern, an output from the subtracter 76 and numeral "0" are entered therein, respectively. The selector 77 receives a control signal CTL2 from the control circuit 90, and selects one of these three inputs to be output in response to the control signal. An output of the selector 77 is input into an adder 78 through one of its input terminals, and a vertical direction reference position Y from the buffer memory 20 is input into the adder 78 through the other input terminal thereof. Further, an output of the adder 78 is output by means of a latch 79 in synchronization with the clock 91, to be entered into the pattern dividing circuit 22.

Figure 11A:
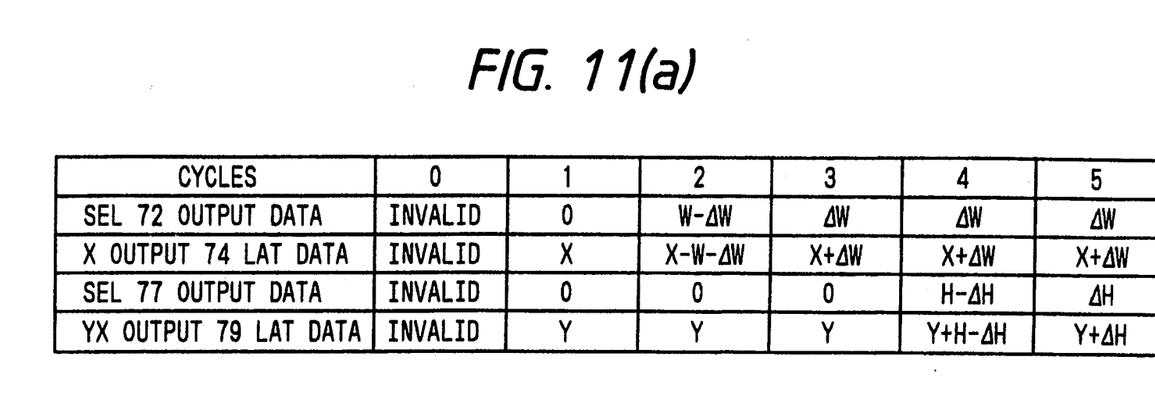
FIGS. 11(a) and (b) explains operations of the contour division circuit of FIG. 10.
Figure 11B:
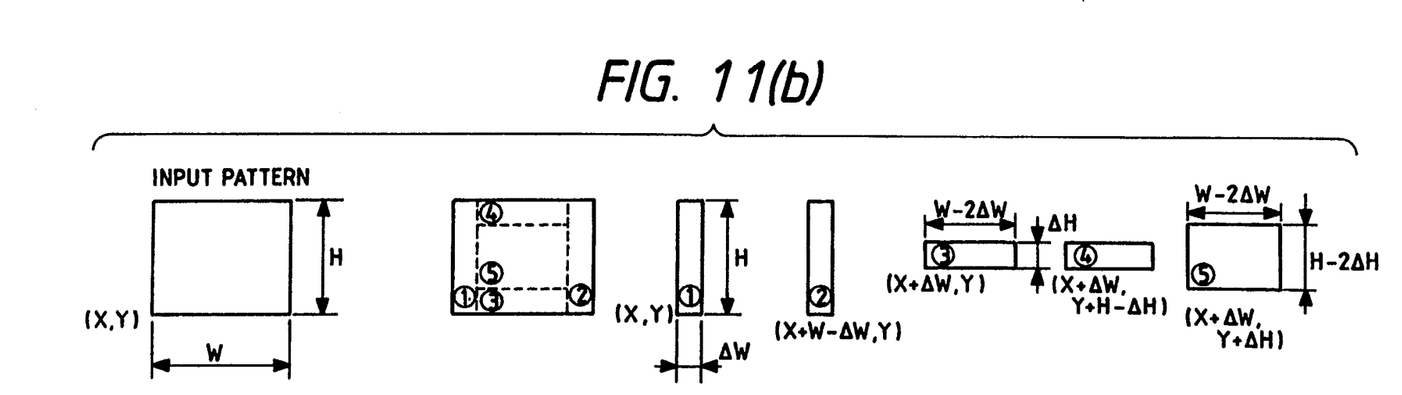

The operation of the foregoing circuit will be explained in detail in the following with reference to FIG. 11. When the first clock signal is output, in response to the output from the control circuit 90, the selector 72 selects numeral "0", and also the selector 77 selects numeral "0". As the result, data from the buffer memory 20 are output as they are as output data X and Y respectively to the pattern dividing circuit 22. When the second clock signal is output, in response to the output from the control circuit 90, the selector 72 selects an output ($W - \Delta W$) of the subtracter 71, and further the selector 77 selects numeral "0". As the result, $X + W - \Delta W$ and Y are output respectively to the pattern dividing circuit 22. When the third clock is output, in response to the output from the control circuit 90, the selector 72 selects an output $\Delta W$ of the register 70, and further the selector 77 selects numeral "0". Thereby, as the result, $X + \Delta W$ and Y are output respectively to the pattern dividing circuit 22. When the fourth clock signal is output, in response to the output of the control circuit 90, the selector 72 selects an output $\Delta W$ of the register 70, further the selector 77 selects an output ($H - \Delta M$) of the subtracter 76. Thereby, as the results, $X + \Delta W$ and $Y + H - \Delta H$ are output respectively to the pattern dividing circuit 22. When the fifth clock is output, in response to the output from the control circuit 90, the selector 72 selects an output ($\Delta W$) of the register 75, further the selector 77 selects an output ($\Delta H$) of the subtracter 78. Thereby, $X + \Delta W$ and $Y + \Delta H$ are output respectively to the pattern dividing circuit 23. When the fifth clock is output, a recess is taken (the 0-th clock) thereby completing this cycle of operation. Then, the process returns to the first clock condition. As described heretofore, in this circuit whose one cycle of operation is constituted by six clock operations, the same operations are repeated as required.

Figure 1:
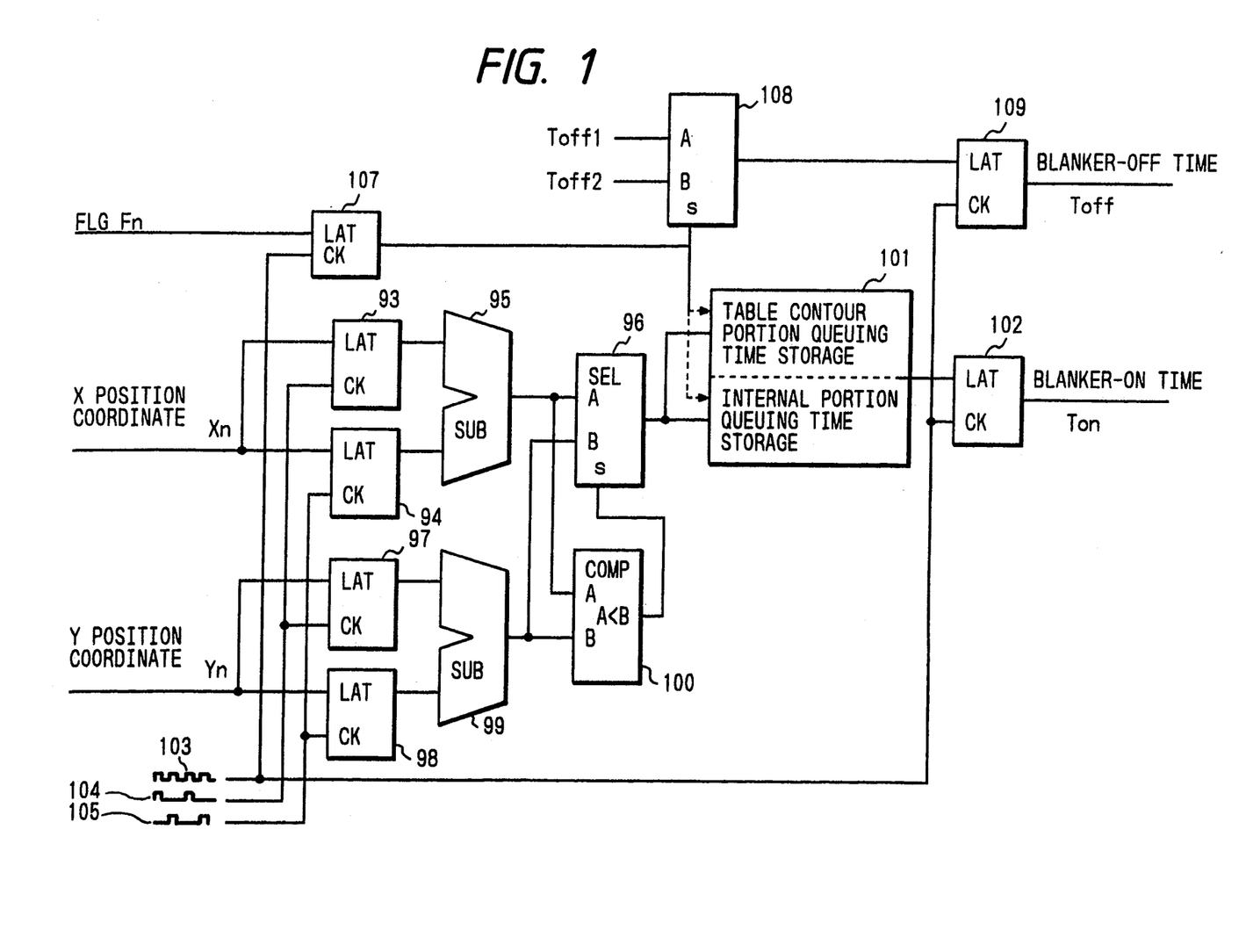
FIG. 1 is a schematic block diagram illustrating a blanker controller of the invention in detail.

The circuit of the blanker controller 10 will be described in detail in the following. With reference to FIG. 1, an X position coordinate data Xn and a Y position coordinate data Yn both from the pattern dividing circuit 22 are entered into a latch 93 and a latch 97 respectively in synchronization with a clock 105. Further, an X position coordinate data Xn and a Y position coordinate data Yn both from the pattern dividing circuit 22 are entered into a latch 94 and a latch 98 respectively in synchronization with a clock 104. The clock signals 104 and 105 are both obtained by dividing a clock 103 into a half, and shifting by a half frequency from each other. Thereby, the data output from the latches 94 and 98 are delayed than the data output from the latches 93 and 97 (delayed one cycle from the clock 103). Thereby, when the data output from the latches 93 and 97 are expressed by Xn and Yn respectively, the data output from the latches 94 and 98 can be expressed as $Xn - 1$ and $Yn - 1$ respectively. An output from the latch 93 and an output from the latch 94 are input into a subtracter 95 respectively. Further, an output from the latch 97 and an output from the latch 98 are input into a subtracter 99 respectively. An output from the subtracter 95 (a variation $\Delta X$ on X position coordinate) and an output from the subtracter 99 (a variation $\Delta Y$ on Y position coordinate) are entered into a selector 96 and a comparator 100 respectively, then according to an output of the comparator 100, an output from the selector 96 is selected so as to output either one of $\Delta X$ or $\Delta Y$ which is greater than the other. The output from the selector 96 is entered into a contour queuing time table 101.

On one hand, a contour flag value Fn from the pattern dividing circuit 22, in synchronization with clock 103, is entered in a latch 107. An output therefrom is input into the contour queuing time table 101. In the contour queuing time table 101 there is prestored a relationship as shown in FIG. 6. The contour queuing time table outputs either one of the variation $\Delta X$ on X position coordinate and the variation $\Delta Y$ on Y position coordinate which is greater than the other, and according to the state of the contour flag Fn. The output thereof is entered into a latch 102 in synchronization with clock 103. An output from the latch 102 is output as a blanker on time Ton to the blanker controller 10.

A selector 108 is input with a blanker off-Time $T_{off1}$ (relatively longer time) as shown in FIG. 5(a) through one input terminal thereof, and with another blanker off-Time $T_{off2}$ (relatively shorter time) through the other input terminal. The selector 108 selects one of the foregoing inputs according to the output of the latch 107. Namely, for the contour portions a relatively longer exposure time is chosen, and for the interior portion a relatively shorter exposure time is chosen. An output from the selector 108 is entered into a latch 109 in synchronization with clock 103.

According to an output from the latch 109 the blanker is turned off (effecting exposure of electron beam 2), then according to an output from the latch 102 the blanker is turned on (interrupting electron beam 2). Through repetition of these operations, electron beam pattern drawing advances.

Advantages and effects attained by this embodiment of the invention will be described below. First, a relationship between a position to be exposed to electron beam 2 and an interruption time thereof will be explained. The deflector 7 has a delay time inevitable as its voltage characteristics, and further causes a kind of oscillation to occur until settling. The time required for the voltage of the deflector 7 to stabilize depends on a voltage applied to the deflector 7, a time constant of the circuit, and an impedance and the like as well, ranges, for example, approximately from 0.1 to 0.2 $\mu$sec. With respect to the most advanced semiconductor devices, in the case of 64M DRAMs, for example, the number of electron beam exposures required becomes as Great as the $10^{10}$ times or the like. Assuming that a settling time per exposure is 0.1 $\mu$sec., a total time required becomes about 1000 seconds, which is nevertheless a short time, but is spent entirely as a loss time.

As shown in FIGS.7(a) and (b), after an exposure to electron beam 2 is completed at a certain time T1 (by turning off blanker 6), the electron beam 2 is interrupted so as to allow for the voltage of deflector 7 to enable repositioning of the electron beam for the next exposure by varying a voltage to be applied to the deflector 7. In this case, in the contour portions where a high precision is required, the exposure of electron beam 2 is permitted to be made (by turning off the blanker 6) at T3 until which a sufficient time for repositioning by means of the deflector 7 has been taken, but in the interior portion where no substantial adverse effect is expected to occur in its finish of a final pattern shaping even if there existed a slight misregistration in the positioning of the electron beam 2, an exposure to the electron beam 2 is permitted to be made (by turning off the blanker) at T2 at which the positioning of the electron beam 2 is still incomplete, namely, settling of the voltage of the deflector is still insufficient. Assuming that a ratio of the number of patterns (the number of exposures to electron beam) between the contour portions and the interior portions in the contour division be approximately 1:1, and an exposure interruption period for one interruption procedure be 0.1 μsec., an interruption period according to this embodiment of the invention can be shortened to about 0.05 μsec. per procedure (equivalent to one half exposure time of the conventional). Thereby, a total exposure queuing time of 1000 seconds for a 64M bit DRAM can be reduced by about 25%.

Next, a second embodiment of the invention will be described with reference to FIG. 12. What differs in the second embodiment of the invention from the foregoing embodiment is only in the sequences of drawing patterns to be output by the contour dividing circuit 21. Only this different section will be explained in the following since the other sections are the same as the first embodiment of the invention. First, the control circuits 66, 90 of the pattern dividing circuit 21 check the state of an X-Y stage transfer flag. This X-Y stage transfer flag is output from the stage controller 17, which flag goes to "1" when there exists a transfer of the X-Y stage 13, and goes to "0" when there exists no transfer of the X-Y stage 13.

Figure 12:
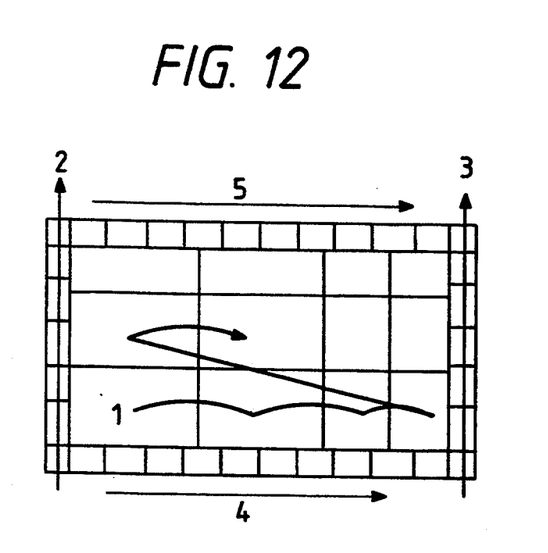
FIG. 12 illustrates a second preferred embodiment of the invention.

When the X-Y stage transfer flag is "1" (an X-Y stage transfer exists), the control circuits 66, 90 of the pattern dividing circuit 21 output relevant data so as to permit a master pattern to be drawn in the order of sequences as designated in FIG. 12. That is, the interior portions are drawn at first, then follows the drawing of the contour portions. Thereby, the control circuits 66, 90 change the order of steps in a cycle in FIGS. 9 and 11, to 0→5→1→2→3→4→.

When the X-Y stage transfer flag is "0" (no X-Y stage transfer exists), the control circuits 66, 90 of the pattern dividing circuit 21 output relevant data so as to permit a master pattern to be drawn in the order of sequences as specified in FIG. 4(c). Namely, as in the first embodiment of the invention, the contour portions are drawn first, then are drawn the interior portions. The control circuits 66, 90 execute the cycles as specified in FIGS. 9 and 11 as they are.

According to the present invention as set forth hereinabove, it has become possible to substantially improve the electron beam pattern drawing speed while maintaining a desired pattern drawing accuracy. Having described our invention as related to the embodiment shown in the accompanying drawings, it is our intention that the invention be not limited by any of the details of description, unless otherwise specified, but rather be construed broadly within its spirit and scope as set out in the accompanying claims.

What we claim is:

1. An electron beam lithography apparatus comprising:
   a) a means for exposing a specimen to an electron beam;
   b) a blanker for blocking exposure of the electron beam on said specimen;
   c) a deflector for deflecting said electron beam according to an applied voltage;
   d) a time selector for selecting either one of a first period of time during which a voltage applied to said deflector is ensured to stabilize from its transient state to a substantially stable state and a second period of time within the first period of time which is shorter than the first period of time; and
   e) a blanker controller for controlling said blanker to be operated in accordance with a selection of the time selector.

2. The electron beam lithography apparatus according to claim 1, wherein said deflector comprises an arrangement for changing an exposure position of said electron beam on said specimen.

3. The electron beam lithography apparatus according to claim 2, further comprising a contour dividing means for dividing a pattern to be drawn into a plurality of contour portions, and wherein said time selection means comprises an arrangement for permitting a selection thereof to be made in accordance with an output from said contour dividing means.

4. The electron beam lithography apparatus according to claim 3, further comprising an arrangement such that an order of pattern drawing sequences is determined in accordance with an output from said contour dividing means.

5. The electron beam lithography apparatus according to claim 4, further comprising an arrangement such that in drawing a region of said plurality of contour portions, said time selection means is caused to select said first period of time.

6. An electron beam lithography apparatus comprising:
   a) a means for exposing a specimen to an electron beam;
   b) a blanker for blocking exposure of the electron beam on said specimen;
   c) a deflector for deflecting said electron beam according to an applied voltage;
   d) a time selector for selecting either one of a first period of time during which a voltage applied to said deflector is ensured to stabilize from its transient state to a substantially stable state and a second period of time within the first period of time which is shorter than the first period of time;
   e) a blanker controller for controlling said blanker to be operated in accordance with a selection of the time selector; and
   f) an arrangement such that said second period of time is caused to change in accordance with a quantity of change in a voltage applied to said deflector.

7. An electron beam lithography apparatus comprising:
   a) a means for exposing a specimen to an electron beam;
   b) a blanker for blocking exposure of the electron beam on said specimen;
   c) a deflector for deflecting said electron beam according to an applied voltage;
   d) a time selector for selecting either one of a first period of time during which a voltage applied to said deflector is ensured to stabilize from its transient state to a substantially stable state and a second period of time within the first period of time which is shorter than the first period of time;
   e) a blanker controller for controlling said blanker to be operated in accordance with a selection of the time selector; and
   f) an arrangement such that a preset time of said second period of time is caused to change in accordance with a quantity of deflection of said electron beam.

8. The electron beam lithography apparatus according to claim 6, further comprising an arrangement such that said first period of time is caused to change in accordance with a quantity of change in the voltage applied to said deflector.

9. An electron beam lithography apparatus comprising:
   a) a means for exposing a specimen to an electron beam;
   b) a blanker for blocking exposure of the electron beam on said specimen;
   c) a deflector for deflecting said electron beam according to an applied voltage;
   d) a time selector for selecting either one of a first period of time during which a voltage applied to said deflector is ensured to get from its transient state approximately to a predetermined application voltage and a second period of time within the first period of time which is shorter than the first period of time; and
   e) a blanker controller for controlling said blanker to be operated in accordance with a result of a selection of said time selector.

10. An electron beam lithography apparatus comprising:
    a) a means for exposing a specimen to an electron beam; and
    b) a stage for moving said specimen; the electron beam lithography apparatus comprises an arrangement such that an order of master pattern drawing sequences is caused to be changed depending on whether a movement of said specimen is present or not.

11. The electron beam lithography apparatus according to claim 10, further comprising:
    a) a pattern dividing means for dividing a pattern to be drawn into a plurality of contour portions and a plurality of interior portions; and
    b) an arrangement such that when there exists a movement of said stage said plurality of interior portions are caused to be drawn first.

12. An electron beam lithography apparatus comprising:
    a) means for exposing a specimen to an electron beam;
    b) exposure stopping means for stopping exposure of the electron beam on said specimen;
    c) means for changing an exposing position of said electron beam on said specimen; and
    d) means for causing said exposure stopping means to operate such that the exposure of said electron beam on said specimen is selectively stopped throughout a period of time required until an exposing position of said electron beam on said specimen becomes substantially stabilized after the same has been changed or throughout another period of time which is shorter than and within the foregoing period of time.

13. An electron beam lithography method for drawing a pattern on a specimen with an electron beam generated by an electron gun, said electron beam lithography method comprising the steps of:
    (a) operating a blanker such that said electron beam is prevented from reaching a specimen;
    (b) changing a voltage to be applied to a deflector after the step (a);
    (c) selecting either one of a first period of time required until the voltage of said deflector becomes substantially stabilized, and a second period of time which is within and shorter than the first period of time;
    (d) waiting, after the step (b), for a time selected in the step (c); and
    (e) operating said blanker so as to permit said electron beam emitted from the electron gun to reach the specimen.

14. An electron beam lithography apparatus comprising:
    a) an exposer exposing a specimen using an electron beam;
    b) a blanker preventing the exposer from exposing said specimen with the electron beam;
    c) a deflector deflecting said electron beam according to an applied voltage;
    d) a controller controlling the blanker according to either one of a first time period or a second time period, wherein the second time period is shorter than the first time period and lies within the first time period, and the first time period is a function of a settling time of said applied voltage.

15. The apparatus according to claim 14, wherein the second time period lies within a transient state of the applied voltage.

* * * * *

UNITED STATES PATENT AND TRADEMARK OFFICE
CERTIFICATE OF CORRECTION

PATENT NO. : 5,384,466  
DATED : Jan. 24, 1995  
INVENTOR(S) : Kazumitsu NAKAMURA et al.

It is certified that error appears in the above-indentified patent and that said Letters Patent is hereby corrected as shown below:

| Column | Line | |
|---|---|---|
| 3 | 17 | Change "explains" to --explain--. |
| 5 | 23 | After "becomes as" delete "many as the tenth power of" and insert --high as--. |
| 5 | 66 | Before "other" insert --the--. |
| 6 | 53 | After "ensuring insert --that--; after "clock" delete "to". |
| 8 | 24 | Change "being" to --is--. |
| 9 | 25 | Change "($H_\Delta M$)" to --($H_\Delta H$)--. |
| 9 | 52 | Before "than" insert --more--. |
| 9 | 68 | Change "which" to --whichever--. |
| 10 | 11 | Change "which" to --whichever--. |

UNITED STATES PATENT AND TRADEMARK OFFICE
CERTIFICATE OF CORRECTION

PATENT NO. : 5,384,466
DATED : Jan. 24, 1995
INVENTOR(S) : Kazumitsu NAKAMURA et al It is certified that error appears in the above-indentified patent and that said Letters Patent is hereby corrected as shown below:

| Column | Line | |
|--------|------|---|
| 10 | 37 | Change "inevitable as" to --directly related to--. |
| 10 | 46 | Change "Great" to --great--. |
| 10 | 47 | Change "the $10^{10}$ times or" to --$10^{10}$, or--. |

Signed and Sealed this

Twenty-third Day of May, 1995

Attest:

BRUCE LEHMAN

*Attesting Officer*     *Commissioner of Patents and Trademarks*